US010572345B2

(12) United States Patent
Blaum et al.

(10) Patent No.: US 10,572,345 B2
(45) Date of Patent: *Feb. 25, 2020

(54) FIRST RESPONDER PARITIES FOR STORAGE ARRAY

(71) Applicant: International Business Machines Corporation, Armonk, NY (US)

(72) Inventors: Mario Blaum, San Jose, CA (US); Steven R. Hetzler, Los Altos, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 100 days.

This patent is subject to a terminal disclaimer.

(21) Appl. No.: 15/819,409

(22) Filed: Nov. 21, 2017

(65) Prior Publication Data

US 2018/0074900 A1     Mar. 15, 2018

Related U.S. Application Data

(63) Continuation of application No. 14/722,356, filed on May 27, 2015, now Pat. No. 9,870,284.

(51) Int. Cl.
*G06F 11/10* (2006.01)
*H03M 13/37* (2006.01)
(Continued)

(52) U.S. Cl.
CPC ....... *G06F 11/1076* (2013.01); *H03M 13/154* (2013.01); *H03M 13/293* (2013.01);
(Continued)

(58) Field of Classification Search
CPC ............ G06F 11/1076; G06F 11/1048; H03M 13/154; H03M 13/373; H03M 13/2945; H03M 13/293; H03M 13/2909
(Continued)

(56) References Cited

U.S. PATENT DOCUMENTS 6,748,488 B2 *  6/2004  Byrd ................... G06F 11/1076
                                                                 711/114
7,788,569 B2     8/2010  Hetzler et al.
(Continued)

OTHER PUBLICATIONS

List of IBM Patents or Patent Applications Treated as Related (Appendix P); Filed Nov. 21, 2017, 2 pages.
(Continued)

*Primary Examiner* — James C Kerveros
(74) *Attorney, Agent, or Firm* — Cantor Colburn LLP; Anthony Curro

(57) ABSTRACT

Embodiments relate to correcting erasures in a storage array. An aspect includes dividing data into a plurality of stripes for storage in a storage array comprising a plurality of storage locations, each stripe comprising M rows and N columns, each of the M rows including a number r of row parities, wherein r is greater than zero. Another aspect includes dividing each stripe into two or more column sets, each column set comprising a respective set of one or more columns of the stripe. Another aspect includes adding a respective first responder parity to each column set, wherein each first responder parity gives parity information for only the two or more columns in the first responder parity's respective column set.

20 Claims, 9 Drawing Sheets

(51) Int. Cl.
*H03M 13/15* (2006.01)
*H03M 13/29* (2006.01)
(52) U.S. Cl.
CPC ... *H03M 13/2909* (2013.01); *H03M 13/2945* (2013.01); *H03M 13/373* (2013.01); *G06F 11/1048* (2013.01)
(58) Field of Classification Search
USPC .......................................................... 714/764
See application file for complete search history.

(56) References Cited

U.S. PATENT DOCUMENTS

| | | | | |
|---|---|---|---|---|
| 8,145,941 | B2* | 3/2012 | Jacobson | G06F 11/1076 714/6.24 |
| 8,171,379 | B2 | 5/2012 | Adarshappanavar et al. | |
| 8,595,606 | B1 | 11/2013 | Feng et al. | |
| 8,793,556 | B1* | 7/2014 | Northcott | G06F 11/1068 365/185.29 |
| 8,914,706 | B2* | 12/2014 | Anderson | G06F 11/1076 714/763 |
| 8,918,701 | B2* | 12/2014 | Blaum | G06F 11/108 714/6.1 |
| 9,356,626 | B2* | 5/2016 | Alexeev | H03M 13/2906 |
| 9,870,284 | B2* | 1/2018 | Blaum | H03M 13/373 |
| 10,055,278 | B2* | 8/2018 | Blaum | G06F 11/108 |
| 2012/0221926 | A1 | 8/2012 | Blaum et al. | |
| 2014/0040702 | A1 | 2/2014 | He et al. | |
| 2014/0310571 | A1* | 10/2014 | Fetterly | G06F 11/1088 714/764 |
| 2016/0320986 | A1* | 11/2016 | Bonwick | G06F 3/0619 |
| 2016/0350186 | A1 | 12/2016 | Blaum et al. | |
| 2018/0095828 | A1* | 4/2018 | Zhu | G06F 3/0619 |

OTHER PUBLICATIONS

"TN-29-17: NAND Flash Design and Use Considerations Introduction," Micron Technology, Inc., 2006, 8 pages.
Blaum, M. et al., "Construction of Partial MDS (PMDS) and Sector-Disk (SD) Codes with Two Global Parity Symbols," arXiv preprint arXiv:1401.4715, Jan. 2014, 5 pages.
Blaum, M. et al., "Construction of two SD codes," arXiv preprint arXiv:1305.1221, May 2013, 8 pages.
Blaum, M. et al., "Generalized Concatenated Types of Codes for Erasure Correction," arXiv preprint arXiv:1406.6270, Jul. 2014, 28 pages.
Blaum, M. et al., "Partial-MDS Codes and their Application to RAID Type of Architectures," arXiv preprint arXiv:1205.0997, Sep. 2014, 35 pages.
Blaum, M., "Construction of PMDS and SD codes extending RAID 5," arXiv preprint arXiv:1305.0032, Apr. 2013, 7 pages.
Cassuto, Yuval et al., "LDPC Codes for Two-Dimensional Arrays," Jan. 2014; 13 pages.
Emvall, Toni et al., "Constructions of Optimal and Almost Optimal Locally Repairable Codes," In Wireless Communications, Vehicular Technology, Information Theory and Aerospace & Electronic Systems (VITAE), 2014 4th International Conference on, pp. 1-5.
Gibson, G. A., "Redundant Disk Arrays: Reliable, Parallel Secondary Storage," The MIT Press, ISBN 0262071428, 1992.
Gopalan, P. et al., "Explicit Maximally Recoverable Codes with Locality," arXiv preprint arXiv:1307.4150, Jul. 2013, 14 pages.
Goparaju, Sreechakra et al., "Binary Cyclic Codes that are Locally Repairable," In Information Theory (ISIT), 2014 IEEE International Symposium on, pp. 676-680, IEEE, 2014.
Huang, C. et al., "Erasure Coding in Windows Azure Storage," 2012 Usenix Annual Technical Conference, Boston, MA, Jun. 2012, 15 pages.
Kamath, G. M. et al., "Explicit MBR All-Symbol Locality Codes," arXiv preprint arXiv:1302.0744, May 2013, 8 pages.
Li, M. et al., "STAIR Codes: A General Family of Erasure Codes for Tolerating Device and Sector Failures in Practical Storage Systems," Proceedings of the 12th USENIX Conference on File and Storage Technologies, Feb. 2014, 17 pages.
MacWilliams, F. J. et al., "The Theory of Error-Correcting Codes," Elsevier, North Holland, Amsterdam, 1977.
Papailiopoulos, D. S. et al., "Locally Repairable Codes," arXiv preprint arXiv:1206.3804, May 2014, 19 pages.
Plank, J. S. et al., "SD Codes: Erasure Codes Designed for How Storage Systems Really Fail," Proceedings of the 11th USENIX Conference on File and Storage Technologies, Feb. 2013, 33 pages.
Plank, J. S. et al., "Sector-Disk (SD) Erasure Codes for Mixed Failure Modes in RAID Systems," ACM Transactions on Storage, vol. 10, No. 1, Article 4, Jan. 2014, pp. 4:1-4:17.
Rawat, A. S. et al., "Optimal Locally Repairable and Secure Codes for Distributed Storage Systems," arXiv preprint arXiv:1210.6954, Oct. 2012, 18 pages.
Rawat, Ankit Singh et al., "On Codes with Availability for Distributed Storage," Abstract Only; In Communications, Control and Signal Processing (ISCCSP), 2014 6th International Symposium on, pp. 15-18, IEEE, 2014.
Sathiamoorthy, M. et al., "XORing Elephants: Novel Erasure Codes for Big Data," arXiv preprint arXiv:1301.3791, Jan. 2013, 16 pages.
Tamo, I. et al., "A family of optimal locally recoverable codes," arXiv preprint arXiv:1311.3284, Jul. 2014, 16 pages.

* cited by examiner

|   |   |   |   |   |   |
|---|---|---|---|---|---|
| H | H | H | H | H | 4 |
| D | D | D | G | V | 3 |
| D | D | D | D | V | 2 |
| D | D | D | D | V | 1 |
| D | D | D | D | V | 0 |

| D | D | D | D | H | 4 |
|---|---|---|---|---|---|
| D | D | D | G | V | 3 |
| D | D | D | G | V | 2 |
| D | D | D | D | V | 1 |
| D | D | D | D | V | 0 |

FIRST RESPONDER PARITIES FOR STORAGE ARRAY

DOMESTIC AND/OR FOREIGN PRIORITY

This application is a continuation of U.S. application Ser. No. 14/722,356, titled "FIRST RESPONDER PARITIES FOR STORAGE ARRAY," filed May 27, 2015, the entire contents of which is incorporated herein by reference.

BACKGROUND

The present invention relates generally to storage systems, and more specifically, to first responder and global parities for a storage array.

Computer systems utilize data redundancy schemes such as parity computations to protect against loss of data in a storage device. In redundant arrays of independent disks (RAID) systems, data values and related parity values are striped across disk drives. RAID systems are typically used to protect information stored in hard disk drive (HDD) arrays from catastrophic disk failures. Two popular RAID schemes are RAID 5, which protects against a single catastrophic disk failure, and RAID 6, which protects against a double catastrophic disk failure.

Flash devices are a type of non-volatile storage devices that can be electrically erased and reprogrammed in large blocks. Like HDDs, flash devices divide the medium into sectors that are typically 512 bytes long. Flash devices further collect sectors into pages with typically eight sectors per page, so that each page contains four thousand or 4 kilo (K) bytes. Each sector is protected by an error correcting code (ECC) that corrects a number of single bit errors. A popular choice is a Bose-Chaudhuri-Hocquenghem (BCH) code, like an eight bit correcting or fifteen bit correcting BCH code, although many variations are possible. BCH codes do hard decision decoding. Low Density Parity Check (LDPC) codes are another popular choice, and in this case soft decision is used. As in HDDs, pages in flash devices may suffer hard errors (HEs). This occurs, for example, when the error correcting capability of the BCH or the LDPC code is exceeded. As compared to HDDs, exceeding the capability of the error-correcting code is more likely in flash devices, both as a page nears the end of its write endurance lifetime, or as a page nears the end of its data retention lifetime. Thus, the number of HEs in flash devices may be expected to grow over time, leaving latent HEs on a device. An array made up of flash devices may encounter a mix of catastrophic device failures combined with possibly more prevalent HEs.

SUMMARY

Embodiments include a method, system, and computer program product for correcting erasures in a storage array. An aspect includes dividing data into a plurality of stripes for storage in a storage array comprising a plurality of storage locations, each stripe comprising M rows and N columns, each of the M rows including a number r of row parities, wherein r is greater than zero. Another aspect includes dividing each stripe into two or more column sets, each column set comprising a respective set of one or more columns of the stripe. Another aspect includes adding a respective first responder parity to each column set, wherein each first responder parity gives parity information for only the two or more columns in the first responder parity's respective column set. Yet another aspect includes, based on an isolated erasure in a column set, correcting the isolated erasure by reading data from only storage locations corresponding to the column set in which the isolated erasure occurred using the first responder parity of the column set.

Further embodiments include a method, system, and computer program product for correcting erasures in a storage array. An aspect includes dividing data into a plurality of stripes for storage in a storage array comprising a plurality of storage locations, each stripe comprising M rows and N columns, each of the M rows including a number r of row parities, wherein r is greater than zero, and each of the N columns a number c of column parities, wherein c is greater than zero. Another aspect includes adding at least one global parity to the stripe. Yet another aspect includes correcting a number of erasures that is greater than $(r+1)(c+1)-1$ using the row, column, and global parities.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

FIGS. 3A-B illustrate contents of an encoded block including first responder parities in accordance with an embodiment.

FIGS. 5A-B illustrate contents of encoded blocks including first responder parities in accordance with an embodiment.

DETAILED DESCRIPTION

Figure 1:
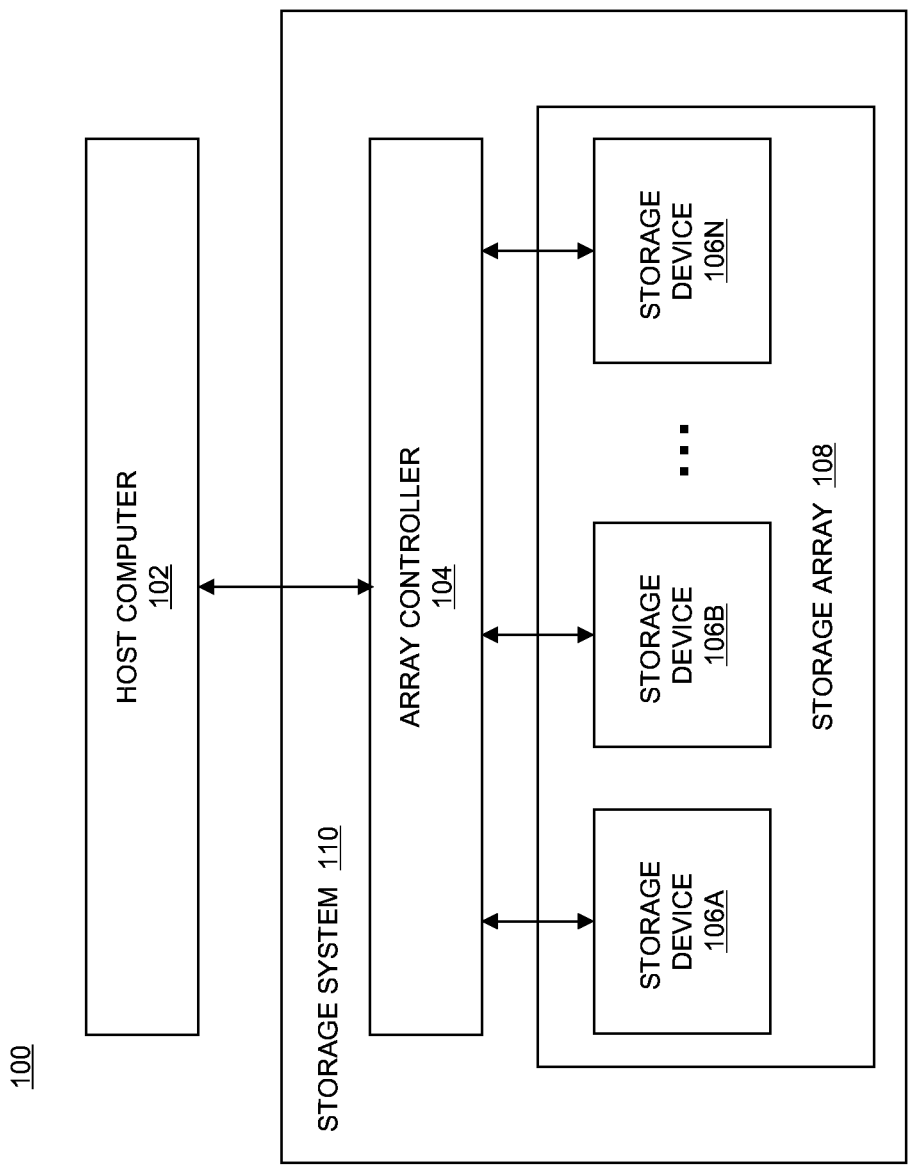
FIG. 1 illustrates a block diagram of a system for providing first responder parities in a storage array in accordance with an embodiment.

Embodiments of first responder parities in a storage array are provided, with exemplary embodiments being discussed below in detail. Addition of first responder parities to data that is stored in a storage array reduces the number of storage devices that need to be accessed in order to recover from a single sector erasure in a stripe, as opposed to requiring access to all of the storage devices in the stripe, as is done in a RAID 5 architecture. Reducing the number of devices that are accessed in the event of a failure may increase the performance of the storage array. Further, global parities that are used in conjunction with row and column parities may also increase the minimum distance of the erasure correcting codes to 6 in some embodiments, or to 7 or 8 in further embodiments. The minimum distance of the code is a parameter that measures the correcting-capability of the code. If the minimum distance of an erasure correcting code is d, the code can recover up to d−1 erasures, no matter where those erasures are located (for example, multiple erasures in the same row or column) in the storage array.

The data in the storage array is stored as stripes, each stripe comprising an M by N array of symbols, i.e., M rows and N columns. The columns may each correspond to respective individual storage devices of the storage array, which may be flash solid state devices (SSDs) in some embodiments. Flash SSDs provide relatively fast memory; however, over time, SSD memory may degrade as many reads and writes are performed, leading to errors in which one or more symbols in a stripe are lost. Each symbol may be a fixed-size sector, or page, comprising a fixed number of bytes of data. At least one of the columns (or devices) in a stripe is a row parity column, comprising a column of symbols that each give parity information for the specific row in the stripe in which the symbol is located. If a whole device fails, the data that was stored on the device is recovered by XORing the data stored in the surviving devices of the storage array. However, additional, isolated pages in other devices may also fail, resulting in data loss. Adding global parity symbols may prevent the data loss. However, all of the storage devices may need to be accessed in order to reconstruct the failed page. If page erasures are common, accessing all of the storage devices has a negative impact on overall system performance.

Figure 3A:
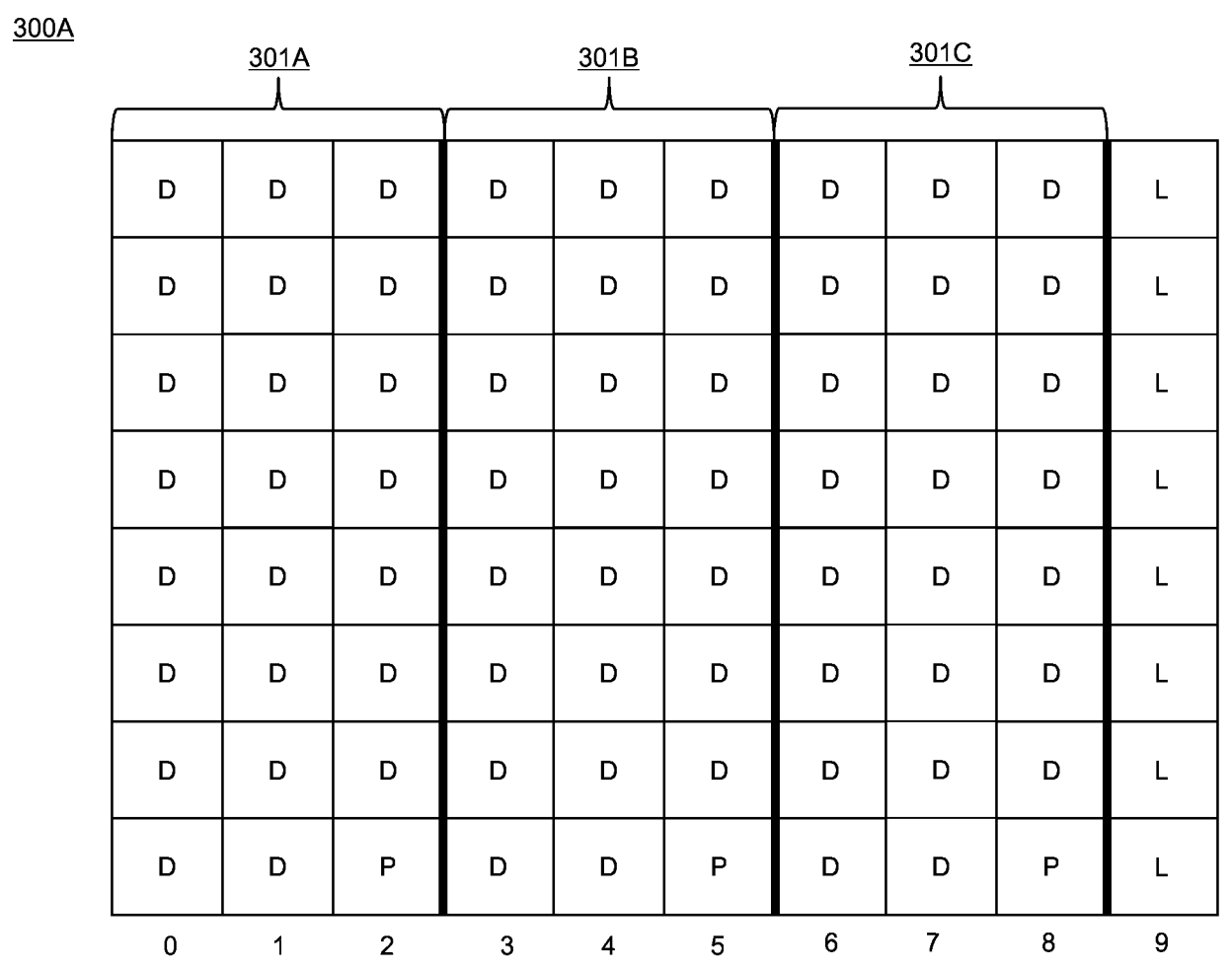
Figure 3B:
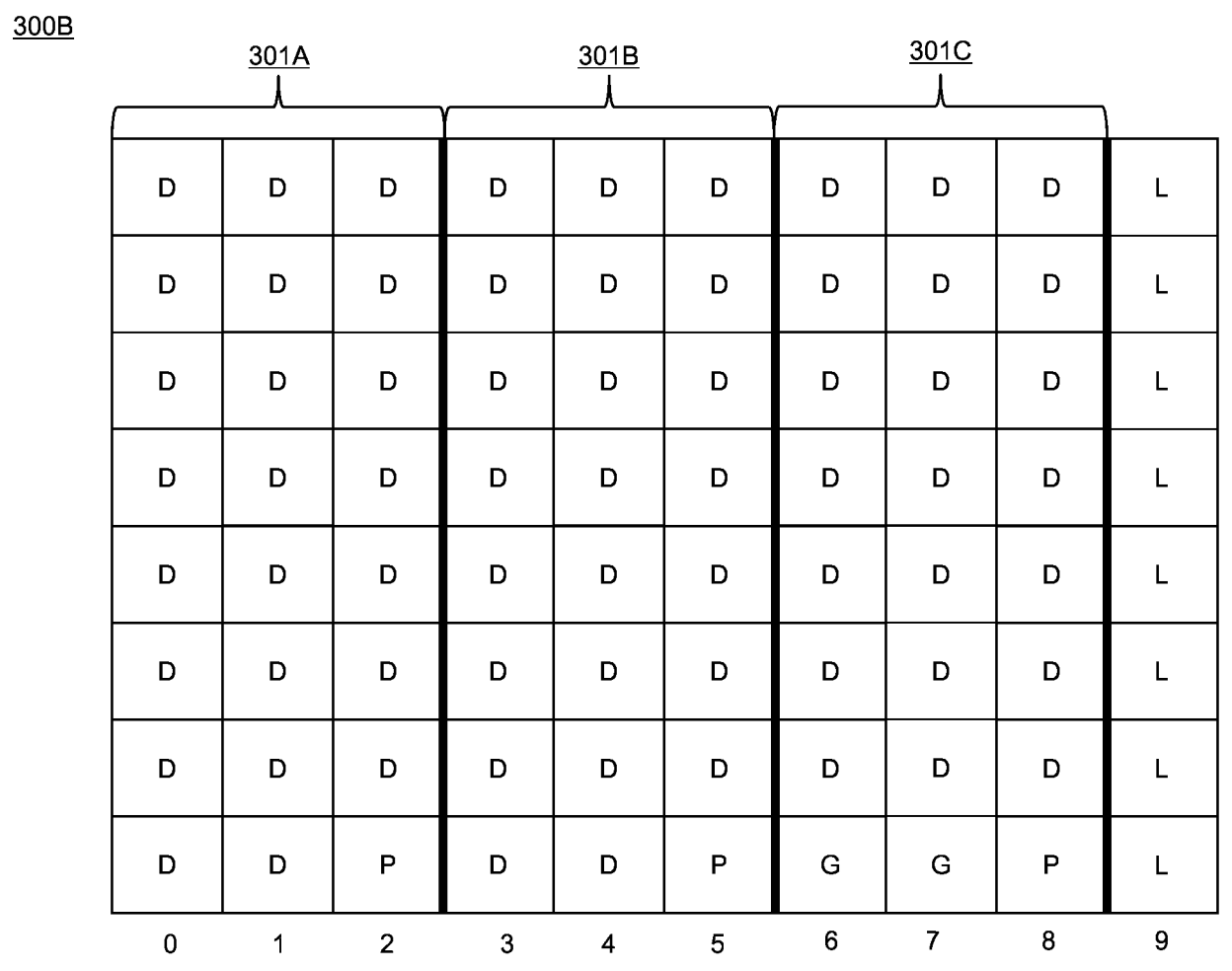

The addition of first responder parities allows an isolated erasure to be corrected by only accessing a subset of the devices. For example, in a storage array made up of 10 storage devices (as illustrated in FIGS. 3A-B, which are discussed below), the data may be divided into 3 sets of 3 consecutive devices, or columns, in addition to the row parity device. As illustrated in FIG. 3A, a first responder parity is inserted into each device set. Therefore, when a page in one of the storage devices is determined to have failed, only the three devices in the same set as the device that holds the failed page are accessed to recover the failed page using the first responder parity. In the case of a more severe failure, like two erasures, all devices may need to be accessed in order to use the row parities to reconstruct the data in the failed symbols. In such embodiments, a minimum distance of 3 may be obtained. In the case of further global parities being added, as depicted in FIG. 3B, a minimum distance of 4 (for one global parity) or of 5 (for two global parities) may be obtained.

In some embodiments of first responder parities, each set of consecutive columns is only a single column of the stripe. In such embodiments, the columns each have a vertical parity that comprises a respective first responder parity. The column parities, together with the row parities, constitute a product code with minimum distance 4 (allowing correction of up to 3 failed pages or sectors). The minimum distance may be increased to 6 (allowing correction of up to 5 failed pages or sectors) or to 7 or 8 (allowing correction of up to 6 or 7 failed pages or sectors) by addition of one or two global parities to the stripe. A single global parity is needed to achieve the minimum distance of 6, and two global parities are needed to achieve the minimum distance of 7 or 8, the codes with minimum distance 8 requiring a larger finite field. In some embodiments, each row corresponds to even parity, and each column to a parity computed over a finite field, for a total of M+N parities.

FIG. 1 illustrates a block diagram of a system 100 for providing first responder parities in accordance with an embodiment. As shown in FIG. 1, a host computer 102 is in communication with an array controller 104 in a storage system 110. The storage system 110 stores data in a storage array 108 made up of N storage devices 106 (where N is greater than one): storage device zero 106A, storage device one 106B, through storage device N−1 106N. In an embodiment, parity bits are stored in the storage devices 106A-N along with host data (e.g., represented as data bits). In an embodiment, the storage devices 106A-N in the storage array 108 are implemented by flash devices. In some embodiments, the array 108 is made up of a plurality of flash devices. The system 100 may comprise a RAID 5 or a RAID 6 architecture in various embodiments. As shown in FIG. 1, the array controller 104 is part of the storage system 110; in another embodiment, the array controller 104 is part of the host computer 102.

Figure 2:
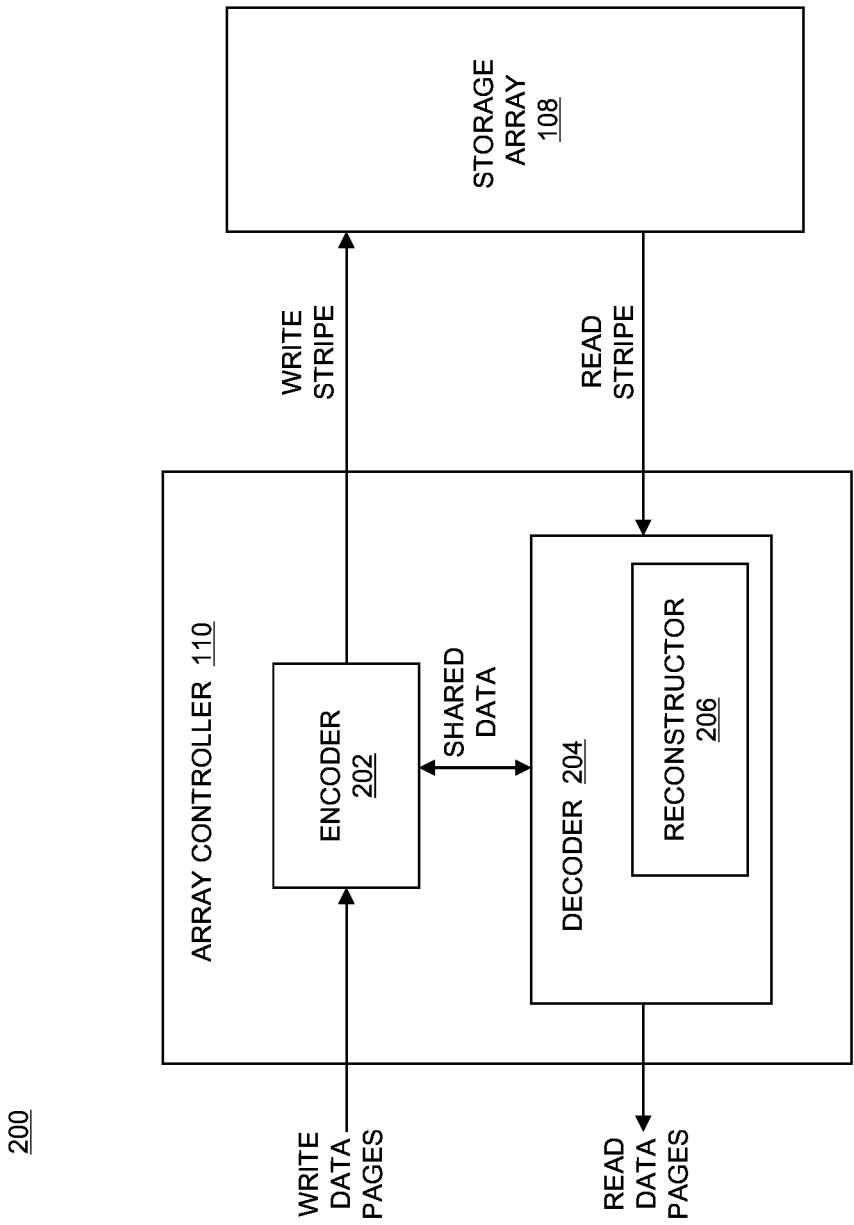
FIG. 2 illustrates a storage system in accordance with an embodiment.

FIG. 2 illustrates the storage system 110 of FIG. 1 in accordance with an embodiment. The storage system 110 may include numerous other elements such as receivers, transmitters, and clocks as known by those of ordinary skill in the art, which are not illustrated for purposes of clarity. As shown in FIG. 2, the array controller 104 includes an encoder 202 and a decoder 204. The encoder 202 is utilized during a write process for receiving one or more write data pages (e.g., from the host computer 102) and generating a write stripe, which includes both data pages and parity pages. In an embodiment, the write stripe is written in the storage array 108 and spans a plurality of rows in the storage array 108. The decoder 204 is utilized during a read process for reading one or more data pages from the storage array 108. When one or more HEs in a page are detected, the decoder reads the whole stripe where the HE(s) has been detected from the storage array 108. The decoder 204 and the encoder 202 both have access to shared data (e.g., data to identify the type of encoding that was applied by the encoder 202 to the write pages to generate the write stripe). The read stripe contains parity bits that are removed by the decoder 204 to generate the read data pages. The decoder 204 includes a reconstructor 206 that is used when a read failure of at least one page has occurred. A read failure occurs, for example, when the error correcting capability of the internal ECC of a page has been exceeded. Typically, the locations of the pages in error are known and thus, the error locations (e.g., the erased page location(s)) and the read stripe) are sent to the reconstructor 206, which attempts to retrieve the erased pages. The retrieval of the erased pages, including the process of correcting any errors in the erased pages (using, e.g., an erasure correcting code) is referred to herein as reconstructing the erased pages.

The decoder 204 may reconstruct erased pages as follows in some embodiments. The ECC and/or the CRC in the decoder 204 detect that a page read has failed. The decoder 204 sends a request to read the pages in the stripe that are needed to reconstruct the erased page, including the parity data, from storage array 108. The decoder 204 then receives the read pages together with the location(s) of the page(s) where the read has failed (i.e., the erased page location(s)), and sends the read data and erasure information to the reconstructor 206. The reconstructor 206 then uses the non-erased data, including the parity data, to reconstruct the erased page(s).

FIG. 3A depicts an embodiment of contents of a portion of an array stored across a plurality of storage devices 106A-N (also referred to herein as a stripe 300A) that may be encoded by the encoder 202 using first responder parities. As used herein, the term "page" refers to a group of memory cells. In an embodiment a page is 4K bytes, however other page sizes may also be implemented by other embodiments. As used herein, the term "encoding stripe" refers to a group of pages that together make up a write stripe and that are encoded with the multiple erasure correcting code as a unit. As used herein, the term "decoding stripe" refers to a group of pages that together make up a read stripe and that are decoded with the multiple erasure correcting code as a unit. As shown in FIG. 3A, stripe 300A comprises a total of 10 storage devices, device 0 to device 9, each of which corresponds to a respective column of the stripe 300A. Each of devices 0 to 9 corresponds to a storage device 106A-N as shown in FIG. 1. Data is distributed across devices 0 to 8 in the pages denoted D. Device 9 is a parity device that holds a column of row parities L. Each row parity L is a parity of only the respective row in which the row parity L is located. Stripe 300A is further divided into device sets 301A-C, and each of device sets 301A-C includes a respective first responder parity P. Device set 301A comprises consecutive devices (or columns) 0, 1, and 2; device set 301B comprises consecutive devices (or columns) 3, 4, and 5, and device set 301C comprises consecutive devices (or columns) 6, 7, and 8. Device set 301A has a first responder parity P located at the bottom of the column corresponding to device 2; Device set 301B has a first responder parity P at the bottom of the column corresponding to device 5, and device set 301C has a first responder parity P located at the bottom of the column corresponding to device 8. Each first responder parity P only gives parity information for the device set in which the first responder parity P is located. For an isolated erasure within a single device set, the device set's respective first responder parity P may be used to recover from the erasure without accessing any devices that are not part of the device set in which the erasure occurred. FIG. 3A is shown for illustrative purposes only; a stripe may comprise any appropriate number of devices, and the devices in a stripe may be divided into any appropriate number of device sets. Further, a device set may comprise any appropriate number of devices. Further, row parities L and first responder parities P may be located in any appropriate location.

FIG. 3B illustrates an embodiment of contents of a portion of an array stored across a plurality of storage devices 106A-N (also referred to herein as a stripe 300B) that may be encoded by the encoder 202 using first responder parities. Stripe 300A includes row parities L and first responder parities P, and is divided into device sets 301A-C, as discussed above with respect to stripe 300A of FIG. 3A. Stripe 300B further comprises two global parities G. In the embodiment of FIG. 3B, global parities G are located at the bottom of the columns corresponding to device 6 and device 7; however, the global parities G may be located in different locations as appropriate in various embodiments. The global parities G comprise parity data for the entire stripe 300B and are used to reconstruct data in the event of a catastrophic failure.

Figure 4:
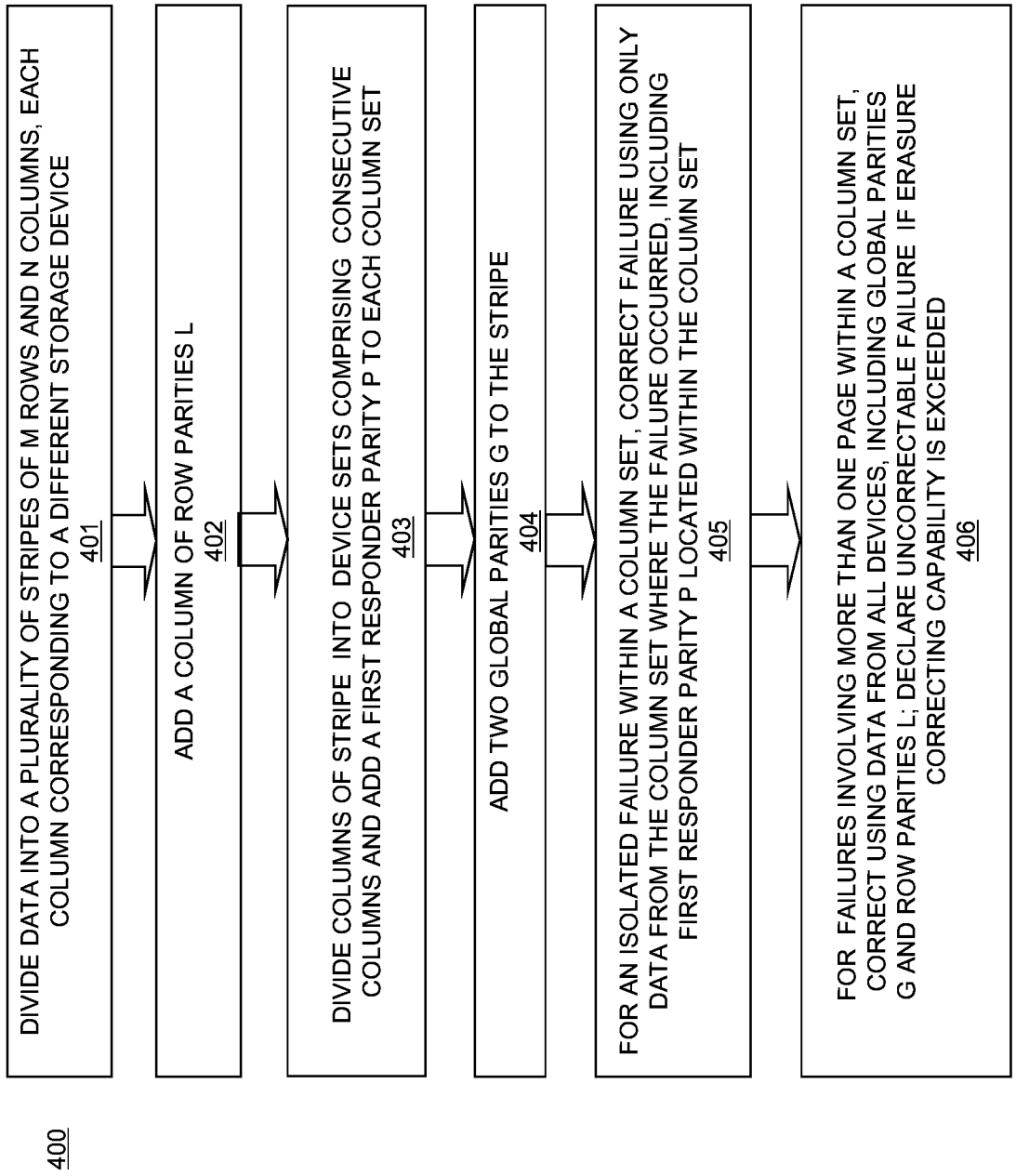
FIG. 4 depicts a process flow for first responder parities in a storage array in accordance with an embodiment.

FIG. 4 depicts a method 400 for first responder parities in a storage array in accordance with an embodiment. FIG. 4 is discussed with respect to FIGS. 1, 2, 3A, and 3B. First, in block 401, the data to be stored in storage array 108 is divided into a plurality of stripes of M rows and N columns, each column corresponding to a respective storage device of storage devices 106A-N in storage array 108. In block 402, a column of row parities L is added to the stripe, as shown in FIGS. 3A-B. In block 403, the stripe is divided into sets of consecutive columns, or devices, such as device sets 301A-C that are shown in FIGS. 3A-B, and a respective first responder parity P is added to each device set, such as first responder parities P that are shown in each of device sets 301A-C of FIG. 3A-B. In block 404, two global parities G are added to the stripe as shown in FIG. 3B. In some embodiments of method 400, the global parities G may be omitted, as shown in FIG. 3A. In block 405, an isolated data page read is determined to have failed by the decoder 204. The decoder 204 reads data from only the devices located in the particular device set where the erasure occurred and the reconstructor 206 uses the data read from the device set, including the first responder parity P of the device set, to reconstruct the page. For example, for an isolated erasure in device 0 in device set 301A, only data from device 0, device 1, and device 2 needs to be read to correct the isolated erasure. In block 406, for a multiple erasures involving multiple devices, data from the entire stripe 300A or 300B is read from the storage array 108, and global parities G and/or row parities L are used in addition to first responder parities P to correct the multiple erasures. An erasure may be corrected in block 406 with a minimum distance of 5; i.e., up to 4 page erasures may be corrected in the stripe 300B, no matter where those erasures are located (e.g., in the same row or column). If the number of erasures exceeds the erasure correcting capability of the code, an uncorrectable failure is declared.

In embodiments corresponding to FIGS. 3A and 4, denoting by $\rho^j(e)$ a rotation j times to the right of vector e, where e is the vector of length n=lt given by $$\underline{e} = \left(1, \alpha, \alpha^2, \ldots, \alpha^{t-1}, \overline{0, 0, \ldots, 0}^{n-t}\right)$$

where $\alpha$ is a primitive element in the finite field $GF(2^b)$ and $t \leq 2^b - 1$, consider the code given by the $(m+\ell \times mn$ parity-check matrix H, where m is the number of rows, n is the number of columns, and l is the number of first responder parities per stripe:

$$H = H_0 H_1 H_2 \ldots H_{m-1} \quad (\text{EQ. 1});$$

where, for $0 \leq i \leq m-1$, $H_i$ is an $(m+\ell \times n$ matrix given by:

$$H_i = \begin{pmatrix} 0 & 0 & \ldots & 0 \\ 0 & 0 & \ldots & 0 \\ \vdots & \vdots & \ddots & \vdots \\ 0 & 0 & \ldots & 0 \\ 1 & 1 & \vdots & 1 \\ 0 & 0 & \ldots & 0 \\ 0 & 0 & \ldots & 0 \\ \vdots & \vdots & \ddots & \vdots \\ 0 & 0 & \ldots & 0 \\ \hline \underline{e} \\ \rho^t(\underline{e}) \\ \rho^{2t}(\underline{e}) \\ \vdots \\ \rho^{(\ell-1)t}(\underline{e}) \end{pmatrix} \to i; \quad (\text{EQ. 2})$$

The code whose parity check matrix is given by EQ. 1 and EQ. 2 has minimum distance 3.

In embodiments corresponding to FIGS. 3B and 4, let the vector $e_i$ of length n=lt, for $0 \leq i \leq l-1$, $l \geq 2$, be given by $$\underline{e}_i = \left(\alpha^{2ni}, \alpha^{2(ni+1)}, \alpha^{2(ni+2)}, \ldots, \alpha^{2(ni+t-i)}, \overline{0, 0, \ldots, 0}^{n-t}\right),$$

where $\alpha$ is a primitive element in the finite field $GF(2^b)$, b is even and $mn \leq 2^b - 1$. Consider the code given by the $(m+l+2) \times mn$ parity-check matrix H, where m is the number of rows, n is the number of columns, and l is the number of first responder parities per stripe:

$$H = (H_0 H_1 H_2 \ldots H_{m-1}) \quad (\text{EQ. 3});$$

where, for $0 \leq i \leq m-1$, $H_i$ is an $(m+\ell+2) \times n$ matrix given by:

$$H_i = \begin{pmatrix} 0 & 0 & \ldots & 0 \\ 0 & 0 & \ldots & 0 \\ \vdots & \vdots & \ddots & \vdots \\ 0 & 0 & \ldots & 0 \\ 1 & 1 & \vdots & 1 \\ 0 & 0 & \ldots & 0 \\ 0 & 0 & \ldots & 0 \\ \vdots & \vdots & \ddots & \vdots \\ 0 & 0 & \ldots & 0 \\ \hline \alpha^{(n-1)i} & \alpha^{(n-1)i+1} & \ldots & \alpha^{(n-1)i+n-2} \\ \alpha^{-(n-1)i} & \alpha^{-(n-1)i-1} & \ldots & \alpha^{-(n-1)i-n+2} \\ \hline \underline{e_i} \\ \alpha^{2t}\rho^t(\underline{e_i}) \\ \alpha^{4t}\rho^{2t}(\underline{e_i}) \\ \vdots \\ \alpha^{2(\ell-1)t}\rho^{(\ell-1)t}(\underline{e_i}) \end{pmatrix} \rightarrow i \quad \text{(EQ. 4)}$$

The code whose parity check matrix is given by EQ. 3 and EQ. 4, has minimum distance 5. The parity check matrices given by EQ. 1, EQ. 2, EQ. 3 and EQ. 4s are presented to illustrate the feasibility of the construction. It should be appreciated that those skilled in the art may present other parity check matrices with the same properties as the ones described in this invention, since there is a plurality of choices for such matrices.

Figure 5A:
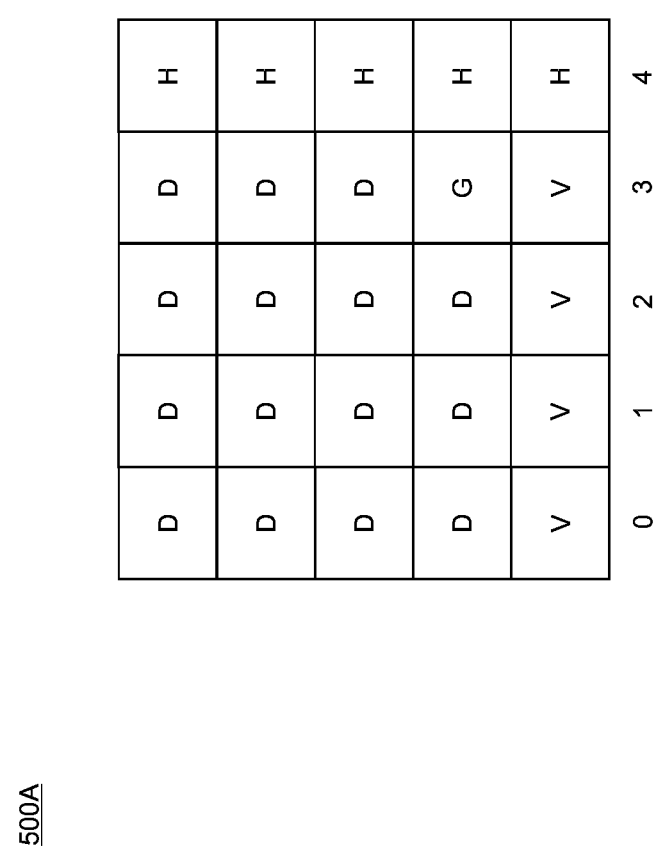
Figure 5B:
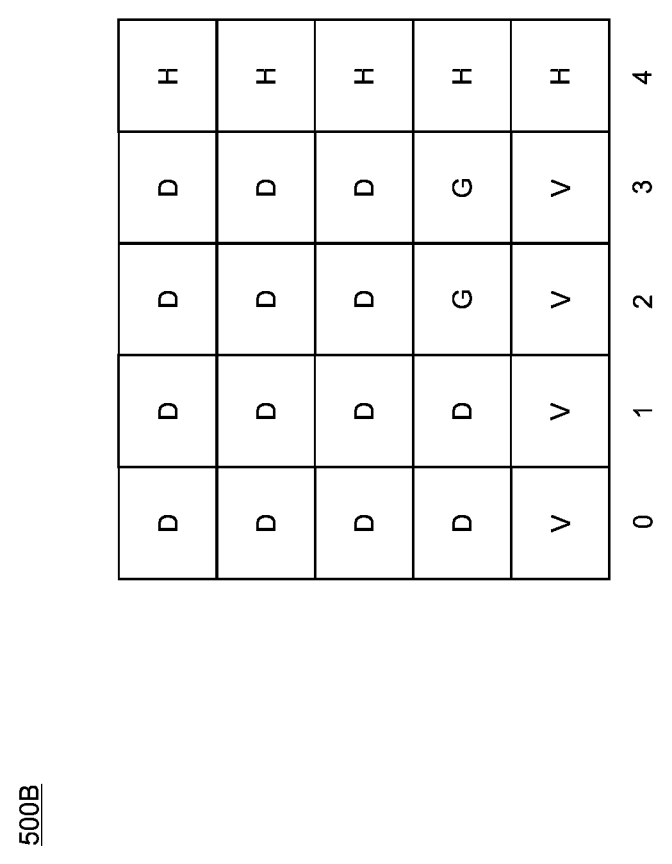

FIGS. 5A-B depicts further embodiments of contents of a portion of an array stored across a plurality of storage devices 106A-N (also referred to herein as stripes 500A and 500B) that may be encoded by the encoder 202 using first responder parities. Stripes 500A and 500B are made up of storage devices device 0 to device 4, each corresponding to a respective column of stripe 500A/500B. Device 4 is a parity device containing a set of row, or horizontal, parities H, which each gives parity information for the particular row in which the row parity H is located. Devices 0 to device 3 in stripes 500A and 500B each further include a respective column parity V, which gives parity information for the particular column (or device) in which the column parity V is located. Each column parity V comprises a first responder parity for a single erasure in the particular column parity V's column, i.e., only data from the device in which a single erasure occurs is required to correct the single erasure using column parity V. Data is distributed across devices 0 to 3 in the pages denoted D. In stripe 500A, a global parity G is further shown inserted into column 3, while in stripe 500B, two global parities G are further shown inserted into columns 2 and 3, respectively. Global parities G give parity information for the entire stripes 500A/500B. For erasures involving multiple pages, the row parities H and the global parity G in FIG. 5A may also be used to reconstruct the erased pages, with a minimum distance of 6. Addition of another global parity G, as shown in column 2 of stripe 500B of FIG. 5B, gives a minimum distance of 7 or 8 in further embodiments. FIGS. 5A-B are shown for illustrative purposes only, a stripe such as stripe 500A or stripe 500B may include any appropriate number of rows and columns. Further, global parities G may be located in any appropriate locations in a stripe such as stripes 500A-B.

Figure 6:
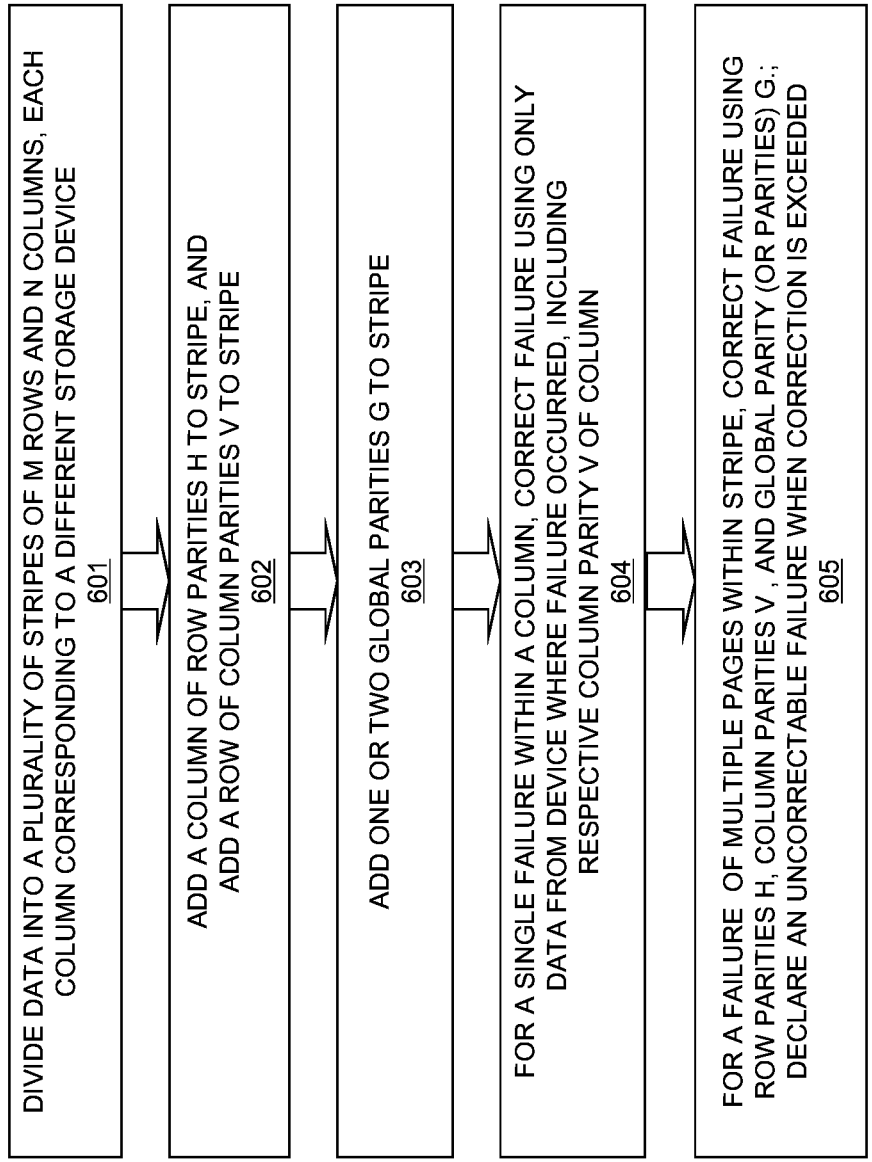
FIG. 6 depicts a process flow for first responder parities in a storage array in accordance with an embodiment.

FIG. 6 illustrates a method 600 for first responder parities in a storage array in accordance with an embodiment. FIG. 6 is discussed with respect to FIGS. 1-2 and 5A-B. First, in block 601, the data to be stored in storage array 108 is divided into a plurality of stripes (such as stripe 500A or stripe 500B) of M rows and N columns, each column corresponding to a respective storage device of storage devices 106A-N of storage array 108. In block 602, a column parity V is added to each column of the stripe, as shown in FIG. 5A-B, a column of row parities H are added to the stripe, as shown in FIGS. 5A-B. In various embodiments of block 602, the column parities V may be added first, and the row parities H may be added subsequently; or the row parities H may be added first, and the column parities V may be added subsequently. In block 603, a global parity G is added to the stripe, as shown in FIG. 5A, or two global parities G are added to the stripe, as shown in FIG. 5B. Global parities G give global parity information for the stripe 500A/500B. In block 604, an isolated data page read is determined to have failed by the decoder 204. The decoder 204 reads data from the particular device where the erasure occurred and the reconstructor 206 uses only the data read from that particular device, including the column parity V of the device, to reconstruct the page. For example, to correct an isolated page erasure in device 0 of stripe 500A, only data from device 0 needs to be read, and the column parity V located in the column corresponding to device 0 is used to correct the isolated page erasure using a first responder approach. In block 605, for multiple erasures involving multiple pages in a stripe 500A/500B, data from the entire stripe 500A or 500B is read from the storage array 108, and row parities H and global parities G are used to correct the multiple erasures. In an embodiment of block 606, the minimum distance of the erasure correcting code with a single global parity G, as shown in FIG. 5A, is 6; i.e., up to 5 page erasures may be corrected in the stripe 500A, no matter where those erasures are located (e.g., in the same row or column). In another embodiment of block 606, the minimum distance of the erasure correcting code with two global parities G, as shown in FIG. 5B, is 7; i.e., up to 6 page erasures may be corrected in the stripe 500B, no matter where those erasures are located (e.g., in the same row or column). In still another embodiment of block 606, involving larger finite fields, the minimum distance of the erasure correcting code with two global parities G, as shown in FIG. 5B, is 8; i.e., up to 7 page erasures may be corrected in the stripe 500B, no matter where those erasures are located (e.g., in the same row or column). Once single erasures in rows and columns are corrected, larger numbers of erasures that exceed the minimum distance of the code are declared uncorrectable.

In embodiments of erasure correcting codes corresponding to FIG. 5A and FIG. 6, having a single global parity G, for a general case of an m×n array, where m is the number of rows and n is the number of columns, whose parity-check matrix H is given by EQ. 5 and EQ. 6 below and $\alpha$ is a primitive element in a finite field $GF(2^b)$ where $\max\{m, n\} \leq 2^b - 1$. the minimum distance of the code is 6.

$$H = (H_0 \ H_1 \ H_2 \ \ldots \ H_{m-1});$$ (EQ. 5)

$$H_i = \begin{pmatrix} 0 & 0 & \ldots & 0 & 0 \\ 0 & 0 & \ldots & 0 & 0 \\ \vdots & \vdots & \ddots & \vdots & \vdots \\ 0 & 0 & \ldots & 0 & 0 \\ 1 & 1 & \vdots & 1 & 1 \\ 0 & 0 & \ldots & 0 & 0 \\ \vdots & \vdots & \ddots & \vdots & \vdots \\ 0 & 0 & \ldots & 0 & 0 \\ \hline 1 & 0 & \ldots & 0 & 0 \\ 0 & 1 & \ldots & 0 & 0 \\ \vdots & \vdots & \ddots & \vdots & \vdots \\ 0 & 0 & \ldots & 1 & 0 \\ \alpha^i & \alpha^{i+1} & \ldots & \alpha^{i+n-2} & \alpha^{i+n-1} \end{pmatrix} \rightarrow i.$$ (EQ. 6)

In embodiments of erasure correcting codes corresponding to FIG. 5B and FIG. 6, having two global parities G, for a general case of an m×n array, where m is the number of rows and n is the number of columns, whose parity-check matrix H is given by EQ. 5 above and EQ. 7 below, where $\alpha$ is a primitive element in a finite field $GF(2^b)$ such that $m \leq 2^b$, $n \leq 2^b - 2$, and $\gcd\{n, 2^b - 1\} \times 1$, the minimum distance of the code is 7. In still another embodiment where $\alpha$ is a primitive element in a finite field $GF(2^b)$ such that $mn \leq 2^b$, the code whose parity-check matrix H is given by EQ. 5 above and EQ. 7 below has minimum distance 8.

$$H_i = \begin{pmatrix} 0 & 0 & \ldots & 0 & 0 \\ 0 & 0 & \ldots & 0 & 0 \\ \vdots & \vdots & \ddots & \vdots & \vdots \\ 0 & 0 & \ldots & 0 & 0 \\ 1 & 1 & \vdots & 1 & 1 \\ 0 & 0 & \ldots & 0 & 0 \\ \vdots & \vdots & \ddots & \vdots & \vdots \\ 0 & 0 & \ldots & 0 & 0 \\ \hline 1 & 0 & \ldots & 0 & 0 \\ 0 & 1 & \ldots & 0 & 0 \\ \vdots & \vdots & \ddots & \vdots & \vdots \\ 0 & 0 & \ldots & 1 & 0 \\ \alpha^{in} & \alpha^{in+1} & \ldots & \alpha^{in+n-2} & \alpha^{in+n-1} \\ \alpha^{-in} & \alpha^{-in-1} & \ldots & \alpha^{-in-(n-2)} & \alpha^{-in-(n-1)} \end{pmatrix} \rightarrow i.$$ (EQ. 7)

Figure 7:
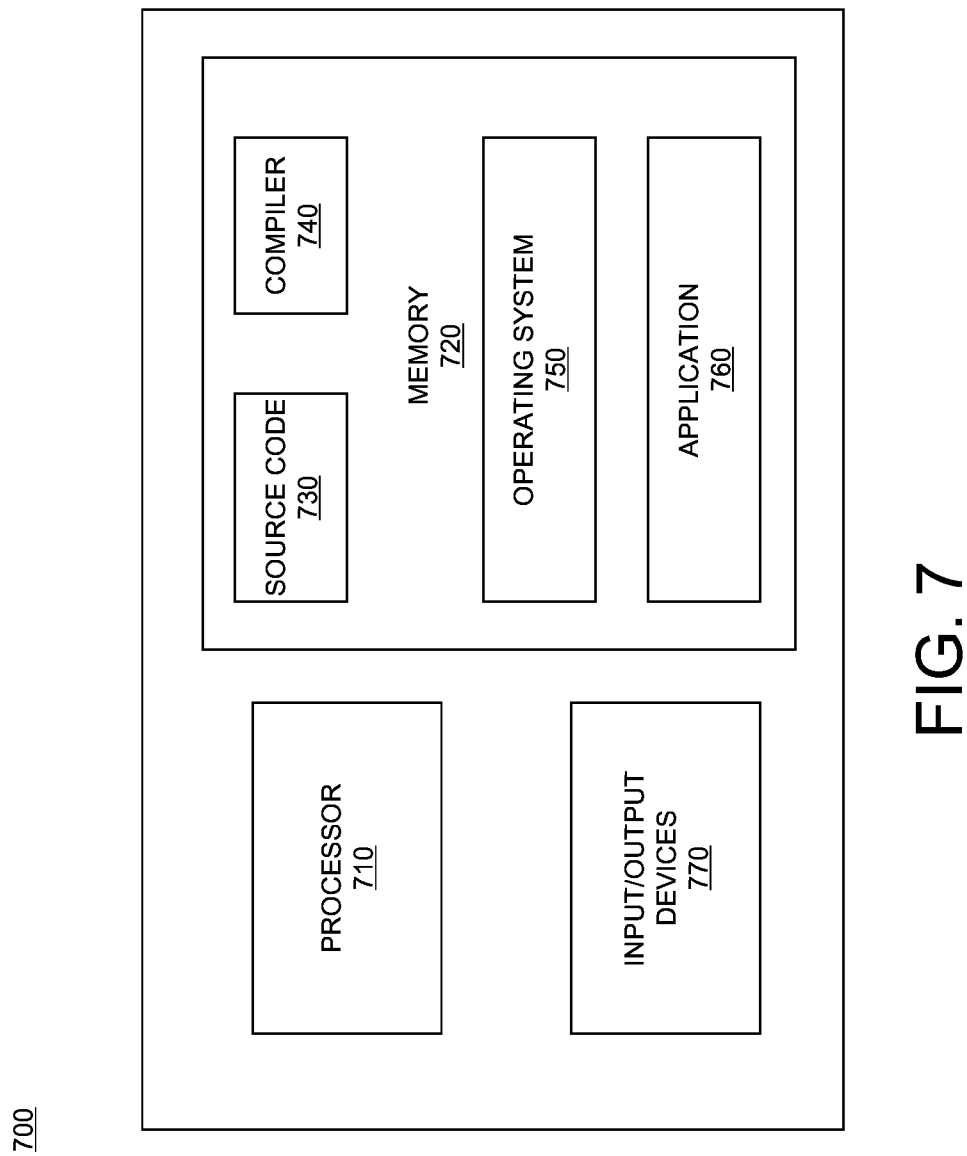
FIG. 7 depicts an embodiment of a computer system that may be used in conjunction with embodiments of first responder parity in a storage array.

FIG. 7 illustrates an example of a computer 700 which may be utilized by exemplary embodiments of first responder parity for a storage array. Various operations discussed above may utilize the capabilities of the computer 700. One or more of the capabilities of the computer 700 may be incorporated in any element, module, application, and/or component discussed herein.

The computer 700 includes, but is not limited to, PCs, workstations, laptops, PDAs, palm devices, servers, storages, and the like. Generally, in terms of hardware architecture, the computer 700 may include one or more processors 710, memory 720, and one or more I/O devices 770 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/or data connections to enable appropriate communications among the aforementioned components.

The processor 710 is a hardware device for executing software that can be stored in the memory 720. The processor 710 can be virtually any custom made or commercially available processor, a central processing unit (CPU), a digital signal processor (DSP), or an auxiliary processor among several processors associated with the computer 700, and the processor 710 may be a semiconductor based microprocessor (in the form of a microchip) or a macroprocessor.

The memory 720 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 720 may incorporate electronic, magnetic, optical, and/or other types of storage media. Note that the memory 720 can have a distributed architecture, where various components are situated remote from one another, but can be accessed by the processor 710.

The software in the memory 720 may include one or more separate programs, each of which comprises an ordered listing of executable instructions for implementing logical functions. The software in the memory 720 includes a suitable operating system (O/S) 750, compiler 740, source code 730, and one or more applications 760 in accordance with exemplary embodiments. As illustrated, the application 760 comprises numerous functional components for implementing the features and operations of the exemplary embodiments. The application 760 of the computer 700 may represent various applications, computational units, logic, functional units, processes, operations, virtual entities, and/or modules in accordance with exemplary embodiments, but the application 760 is not meant to be a limitation.

The operating system 750 controls the execution of other computer programs, and provides scheduling, input-output control, file and data management, memory management, and communication control and related services. It is contemplated by the inventors that the application 760 for implementing exemplary embodiments may be applicable on all commercially available operating systems.

Application 760 may be a source program, executable program (object code), script, or any other entity comprising a set of instructions to be performed. When a source program, then the program is usually translated via a compiler (such as the compiler 740), assembler, interpreter, or the like, which may or may not be included within the memory 720, so as to operate properly in connection with the O/S 750. Furthermore, the application 760 can be written as an object oriented programming language, which has classes of data and methods, or a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 770 may include input devices such as, for example but not limited to, a mouse, keyboard, scanner, microphone, camera, etc. Furthermore, the I/O devices 770 may also include output devices, for example but not limited to a printer, display, etc. Finally, the I/O devices 770 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 770 also include components for communicating over various networks, such as the Internet or intranet.

If the computer 700 is a PC, workstation, intelligent device or the like, the software in the memory 720 may further include a basic input output system (BIOS) (omitted for simplicity). The BIOS is a set of essential software routines that initialize and test hardware at startup, start the O/S 750, and support the transfer of data among the hardware devices. The BIOS is stored in some type of read-only-memory, such as ROM, PROM, EPROM, EEPROM or the like, so that the BIOS can be executed when the computer 700 is activated.

When the computer 700 is in operation, the processor 710 is configured to execute software stored within the memory 720, to communicate data to and from the memory 720, and to generally control operations of the computer 700 pursuant to the software. The application 760 and the O/S 750 are read, in whole or in part, by the processor 710, perhaps buffered within the processor 710, and then executed.

When the application 760 is implemented in software it should be noted that the application 760 can be stored on virtually any computer readable storage medium for use by or in connection with any computer related system or method. In the context of this document, a computer readable storage medium may be an electronic, magnetic, optical, or other physical device or means that can contain or store a computer program for use by or in connection with a computer related system or method.

The application 760 can be embodied in any computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable storage medium" can be any means that can store the program for use by or in connection with the instruction execution system, apparatus, or device. The computer readable storage medium can be, for example but not limited to, an electronic, magnetic, optical, electromagnetic, or semiconductor system, apparatus, or a device.

More specific examples (a nonexhaustive list) of the computer-readable storage medium may include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable storage medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 760 is implemented in hardware, the application 760 can be implemented with any one or a combination of the following technologies, which are well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Technical effects and benefits include correction of errors in a storage array by reading from a reduced number of storage devices of the storage array.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for correcting erasures in a storage array, the method comprising:
   dividing data into a plurality of stripes for storage in a storage array comprising a plurality of storage locations, each stripe comprising M rows and N columns, each of the M rows including a number r of row parities, wherein r is greater than zero;
   dividing each stripe into two or more column sets, each column set comprising a respective set of two or more columns of the stripe;
   adding a respective first responder parity to each column set, wherein each first responder parity gives parity information for only the two or more columns of the respective column set of the first responder parity; and
   based on an isolated erasure in a column set, correcting the isolated erasure by reading data from only storage locations corresponding to the column set in which the isolated erasure occurred using the first responder parity of the column set.

2. The method of claim 1, further comprising:
   based on r+1 erasures located in a row within a first column set of a stripe, correcting the erasures by reading data from storage locations that are located outside of the first column set in the stripe.

3. The method of claim 2, wherein the storage locations in the stripe are in a finite field of a size larger than a number of columns in a single column set.

4. The method of claim 1, further comprising:
   adding at least one global parity to the stripe; and
   correcting a number of erasures greater than r+1 using the at least one global parity.

5. The method of claim 4, further comprising:
   based on r+2 erasures located in a row within a first column set of a stripe, correcting the erasures by reading data from storage locations within the whole stripe.

6. The method of claim 4, wherein r=1 and a number of the global parities is 2.

7. The method of claim 6, wherein a minimum distance of an erasure-correcting code corresponding to a stripe is 5.

8. The method of claim 7, wherein the storage locations in the stripe are in a finite field having a size larger than MN.

9. A computer program product for correcting erasures in a storage array, the computer program product comprising:
   a computer readable storage medium having program instructions embodied therewith, the program instructions readable by a processing circuit to cause the processing circuit to perform a method comprising:
   dividing data into a plurality of stripes for storage in a storage array comprising a plurality of storage locations, each stripe comprising M rows and N columns, each of the M rows including a number r of row parities, wherein r is greater than zero;

dividing each stripe into two or more column sets, each column set comprising a respective set of two or more columns of the stripe;

adding a respective first responder parity to each column set, wherein each first responder parity gives parity information for only the two or more of the respective column set of the first responder parity; and based on an isolated erasure in a column set, correcting the isolated erasure by reading data from only storage locations corresponding to the column set in which the isolated erasure occurred using the first responder parity of the column set.

10. The computer program product of claim 9, further comprising:

based on r+1 erasures located in a row within a first column set of a stripe, correcting the erasures by reading data from storage locations that are located outside of the first column set in the stripe.

11. The computer program product of claim 9, further comprising:

adding at least one global parity to the stripe; and correcting a number of erasures greater than r+1 using the at least one global parity.

12. The computer program product of claim 11, further comprising:

based on r+2 erasures located within a row within a first column set of a stripe, correcting the r+2 erasures by reading data from storage locations that are located outside of the first column set in the stripe.

13. The computer program product of claim 11, wherein r=1 and a number of the global parities is 2.

14. A method for correcting erasures in a storage array, the method comprising:

dividing data into a plurality of stripes for storage in a storage array comprising a plurality of storage locations, each stripe comprising M rows and N columns, each of the M rows including a number r of row parities, wherein r is greater than zero, and each of the N columns a number c of column parities, wherein c is greater than zero;

dividing each stripe into two or more column sets, each column set comprising a respective set of two or more columns of the stripe;

adding a respective first responder parity to each column set to enable an isolated erasure to be corrected by only accessing the two or more columns in the first responder parity's respective column set, wherein each first responder parity only provides parity information for the column set in which the first responder parity is located;

adding at least one global parity to the stripe;

based on the isolated erasure in a column set, correcting the isolated erasure by reading data from only storage locations corresponding to the column set in which the isolated erasure occurred using the first responder parity of the column set; and correcting a number of erasures that is greater than (r+1)(c+1)−1 using the row, column, and global parities.

15. The method of claim 14, wherein r=1 and c=1.

16. The method of claim 15, wherein a number of the global parities is one.

17. The method of claim 16, wherein a minimum distance of an erasure-correcting code corresponding to a stripe is 6, and wherein the storage locations in the stripe are in a finite field having a size larger than both M and N.

18. The method of claim 15, wherein a number of the global parities is two.

19. The method of claim 18, wherein a minimum distance of an erasure-correcting code corresponding to a stripe is 7, and wherein the storage locations in the stripe are in a finite field having a size larger than M−1 and N+1 and the size of the field minus 1 and N are relatively prime.

20. The method of claim 19, wherein a minimum distance of an erasure-correcting code corresponding to a stripe is 8, and wherein the storage locations in the stripe are in a finite field having a size larger than MN.

* * * * *